United States Patent
Sekiguchi et al.

(10) Patent No.: US 7,463,104 B2
(45) Date of Patent: Dec. 9, 2008

(54) FREQUENCY TUNABLE OSCILLATOR

(75) Inventors: Ryota Sekiguchi, Kawasaki (JP); Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 352 days.

(21) Appl. No.: 10/587,261

(22) PCT Filed: Mar. 27, 2006

(86) PCT No.: PCT/JP2006/306992

§ 371 (c)(1), (2), (4) Date: Jul. 26, 2006

(87) PCT Pub. No.: WO2006/104233

PCT Pub. Date: Oct. 5, 2006

(65) Prior Publication Data

US 2008/0231384 A1    Sep. 25, 2008

(30) Foreign Application Priority Data

Mar. 28, 2005 (JP) ............................. 2005-093228

(51) Int. Cl.
*H03B 5/18* (2006.01)
(52) U.S. Cl. .................... 331/107 SL; 331/96
(58) Field of Classification Search .................. 331/96, 331/107 DP, 107 SL
See application file for complete search history.

(56) References Cited

U.S. PATENT DOCUMENTS

| 5,617,104 | A | 4/1997 | Das |
| 7,248,995 | B2 | 7/2007 | Itsuji et al. |
| 2001/0017577 | A1* | 8/2001 | Toko et al. ................. 333/161 |
| 2003/0122628 | A1 | 7/2003 | Aikawa et al. |
| 2006/0085160 | A1 | 4/2006 | Ouchi et al. |
| 2006/0188398 | A1 | 8/2006 | Yano et al. |
| 2006/0197021 | A1 | 9/2006 | Ouchi |

(Continued)

FOREIGN PATENT DOCUMENTS

EP    0 288 135 A2    10/1988

(Continued)

OTHER PUBLICATIONS

Kuki, T., et al.; "Design of a Microwave Variable Delay Line Using Liquid Crystal, and a Study of Its Insertion Loss" XP-002385403, Electronics and Communications in Japan, Part 2, vol. 85, No. 2, 2002. pp. 36 to 42.

(Continued)

*Primary Examiner*—David Mis
(74) *Attorney, Agent, or Firm*—Fitzpatrick, Cella, Harper & Scinto

(57) ABSTRACT

There is provided a frequency tunable oscillator that has less degradation of oscillation characteristics due to a parasitic reactance component or the like without mounting therein a lumped constant element such as a variable capacitance element. The frequency tunable oscillator includes a negative resistance element and a resonator which together form a feedback circuit. The frequency tunable oscillator further includes in at least a part of the feedback circuit, a distributed constant material so configured as to have a distributed constant such that an electrical length in the resonator is modulated, and a modification means for externally modifying the distributed constant material, wherein the oscillation frequency can be varied through the external modification by the modification means.

8 Claims, 5 Drawing Sheets

U.S. PATENT DOCUMENTS

| | | |
|---|---|---|
| 2006/0214176 A1 | 9/2006 | Ouchi et al. |
| 2006/0227340 A1 | 10/2006 | Shioda et al. |
| 2006/0244629 A1 | 11/2006 | Miyazaki et al. |
| 2007/0030115 A1 | 2/2007 | Itsuji et al. |
| 2007/0195921 A1 | 8/2007 | Ouchi |
| 2007/0215808 A1 | 9/2007 | Sekiguchi et al. |
| 2007/0229094 A1 | 10/2007 | Kasai et al. |
| 2007/0235718 A1 | 10/2007 | Kasai et al. |
| 2007/0252604 A1 | 11/2007 | Ouchi et al. |
| 2007/0279136 A1 | 12/2007 | Koyama et al. |

FOREIGN PATENT DOCUMENTS

| | | |
|---|---|---|
| JP | 2003-17912 A | 1/2003 |
| JP | 2003-204223 A | 7/2003 |

OTHER PUBLICATIONS

Utsumi, Y., et al.; "Dielectric Properties of Microstrip-Line Adaptive Liquid Crystal Devices", XP-002385402, Electronics and Communications in Japan, Part 2, vol. 87, No. 10, 2004 pp. 13 to 24.

Tsai, T., et al.; "Terahertz time-domain spectroscopy studies of the optical constants of the nematic liquid crystal 5CB", Applied Optics, vol. 42, pp. 2372 to 2376 (2003).

Brian C. Wadell; "Transmission Line Design Handbook", Artech House Inc., Chapter 3, 1991, pp. 45 to 179.

U.S. Appl. No. 11/632,958, filed Jan. 19, 2007, Inventor: Toshihiko Ouchi.

PCT International Search Report and Written Opinion of the International Searching Authority; Mailing Date Jun. 7, 2006.

* cited by examiner

US 7,463,104 B2

FREQUENCY TUNABLE OSCILLATOR

TECHNICAL FIELD

The present invention relates to a frequency tunable oscillator, a sensing apparatus, or the like, especially, relates to a frequency tunable oscillator in a frequency region from millimeter-wave to terahertz-wave (30 GHz to 30 THz).

BACKGROUND ART

Hitherto, as a frequency tunable oscillator in a microwave band, there is known a frequency tunable oscillator in which a variable capacitance element is provided in a part of an oscillator and the oscillation frequency can be varied by controlling the capacitance through an external electric field (Japanese Patent Application Laid-Open No. 2003-204223).

Referring to FIGS. 11A and 11B, one example of the frequency tunable oscillator disclosed in Japanese Patent Application Laid-Open No. 2003-204223 above will be described. FIG. 11A is a plan view, and FIG. 11B is a cross-sectional view. In the frequency tunable oscillator, a negative resistance element 52 and a CPW (coplanar waveguide) resonator 51 form a feedback circuit via a ground conductor 54, and a variable capacitance diode 53 is mounted parallel thereto. The negative resistance element 52 supplies an electric power to the feedback circuit and resonance is maintained for oscillation. The oscillation frequency depends on the resonant frequency determined by the capacitances of the CPW resonator 51 and the variable capacitance diode 53. Therefore, when a controlling electric field applied to the variable capacitance diode 53 is varied, the capacitance of the variable capacitance diode 53 is varied, thereby enabling the oscillation frequency to be varied. Incidentally, in FIGS. 11A and 11B, reference numeral 531 denotes a capacitor, reference numeral 57 denotes an output line, and reference numeral 58 denotes a dielectric.

However, in the conventional frequency tunable oscillator whose oscillation frequency is selected from the frequency band of from millimeter-wave to terahertz wave, a parasitic reactance component generated when mounting a variable capacitance element may degrade the oscillation characteristics. For example, since the capacitance of the variable capacitance element used in the above mentioned frequency band is small, when a relatively large parasitic capacitance is generated, most of high frequencies will bypass through the parasitic capacitance, so that sufficient capacitance change ratio cannot be obtained. Therefore, the range in which the oscillation frequency can be varied becomes narrow. In addition, there is a case where a parasitic resonance structure including a parasitic inductance generated in a mounted structure may be formed, and in a typical case, the oscillation output will lower.

DISCLOSURE OF THE INVENTION

Therefore, the present invention provides a frequency tunable oscillator comprising a negative resistance element and a resonator together forming a feedback circuit, and further comprising, in at least a part of the feedback circuit, a distributed constant material so configured as to have a distributed constant such that an electrical length in the resonator is modulated and a modification means for externally modifying the distributed constant material, wherein the oscillation frequency can be varied through the external modification by the modification means.

The configuration of the frequency tunable oscillator of the present invention is based on the following conception. That is, especially in a variable frequency oscillator of millimeter-wave to terahertz-wave band, it is important to find out a method which does not depend on a variable capacitance element as a lumped constant element (an element with a relatively small size as compared to the wavelength of an electromagnetic wave involved) which generates the above mentioned parasitic reactance component when mounted. Taking account of this matter, in the present invention, the above distributed constant material is utilized which can modulate the electrical length ((physical length of resonator)/$\sqrt{\epsilon\text{eff}}$; $\epsilon$eff being effective dielectric constant in resonator) of a resonator of an oscillator.

Moreover, in view of the above problem, the present invention also provides a sensing apparatus comprising the above-mentioned frequency tunable oscillator, wherein an electromagnetic wave outputted from the frequency tunable oscillator is lead into an analyte, and an electromagnetic wave from the analyte carrying an information to the analyte is detected by detection means.

According to the present invention, since the mounting of a lumped constant element such as a variable capacitance element is not necessary, there is obtained the effect that the above-mentioned problem of the degradation of oscillation characteristics due to a parasitic reactance component does not occur. Further, when a distributed constant material in which relatively large modulation of the electrical length can be obtained is utilized, there is also obtained the effect that the oscillation frequency can be varied over a relatively wide frequency region.

BEST MODE FOR CARRYING OUT THE INVENTION

Figure 1:
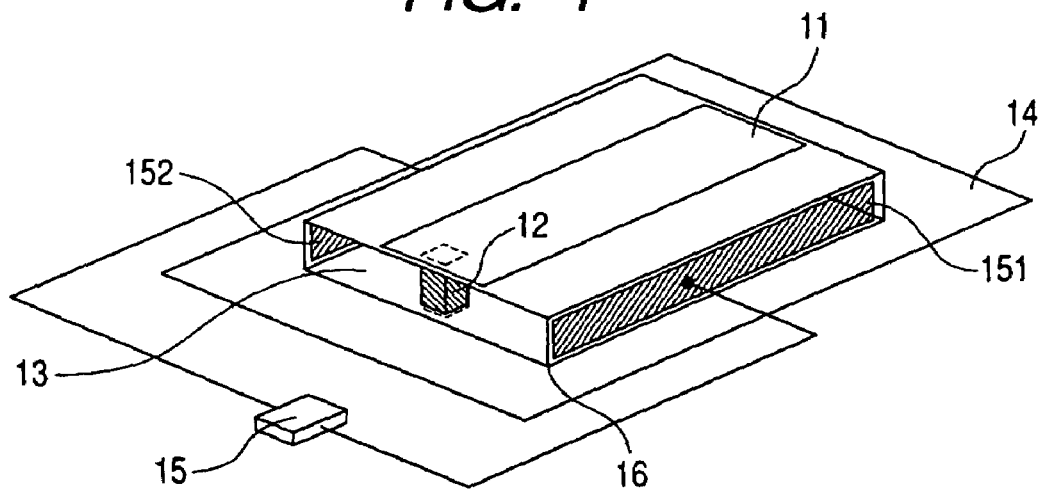
FIG. 1 is a perspective view illustrating one embodiment of the frequency tunable oscillator according to the present invention.

Now, referring to FIG. 1, a preferred embodiment of the present invention will be described below.

The frequency tunable oscillator according to the present embodiment is configured such that a negative resistance element 12 and a microstrip resonator 11 form, via a ground conductor 14, a feedback circuit, and a liquid crystal 13 is electromagnetically connected to the microstrip resonator 11. The modification means (151,152) modifies the position of the liquid crystal so that the oscillation frequency can be varied through the external modification by the modification means. The negative resistance element 12 supplies a high frequency to the feedback circuit and oscillation starts when the gain becomes sufficient. As a negative resistance element 12 in which a gain can be obtained in the frequency band from a millimeter-wave to a terahertz-wave, for example, a resonant tunneling diode based on a photon-assisted tunneling can be selected, and integrating this to be mounted in a feedback circuit is preferable for decreasing a gain reduction. The oscillation frequency depends on the electrical length in the microstrip resonator 11. Therefore, when a controlling electric field applied to the liquid crystal 13 is varied, the electrical length of the microstrip resonator 11 is modulated due to a change in the dielectric constant (relative permittivity) in the liquid crystal 13, thereby enabling the oscillation frequency to be variable. Here, the liquid crystal 13 is held by a container-shaped holding material 16, and the controlling electric field is controlled using an external electric field control apparatus 15 including a pair of controlling electrodes 151, 152 formed as shown in FIG. 1 so as to sandwich the liquid crystal 13. The holding material 16 is formed of a material having a low loss with respect to the electromagnetic wave.

Figure 2:
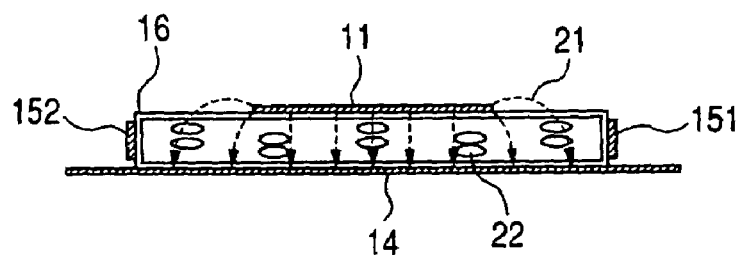
FIG. 2 is a cross-sectional view illustrating the mechanism how the frequency tunable oscillator according to the present invention allows the oscillation frequency to be variable.

In such a structure, the mechanism in which the electrical length of the microstrip resonator 11 can be modulated, that is, the mechanism of the variation of the dielectric constant in the liquid crystal 13 will be described with reference to FIG. 2, which is a view showing a cross-sectional structure taken along a lateral direction in FIG. 1 (the direction perpendicular to the longitudinal direction of the resonator). The liquid crystal 13 has a property that the orientation of liquid crystal molecules 22 is varied by a followable, controlling electric field. Generally, since liquid crystal molecule have different dielectric constants in their long axis direction and in their short axis direction, they act as a dielectric having anisotropy of dielectric constant (permittivity) with respect to a high frequency electric field 21 which does not allow the orientation of liquid crystal molecules to follow. In typical cases, when the long axis direction of the liquid crystal molecules 22 is parallel to the direction of the high frequency electric field 21, the dielectric constant is high, and when the direction is perpendicular to the direction of the high frequency electric field 21, the dielectric constant is low. Therefore, when the dielectric constant of the liquid crystal 13 electromagnetically coupled to the high frequency electric field confined in the microstrip resonator 11 is high, the electrical length of the microstrip resonator 11 becomes large, whereby the oscillation frequency shifts to a lower frequency side. On the contrary, when the dielectric constant of the liquid crystal 13 electromagnetically coupled to the electric field confined in the microstrip resonator 11 is low, the electrical length of the microstrip resonator 11 becomes small, whereby the oscillation frequency shifts to a higher frequency side.

In order to widen the range of variable oscillation frequency (i.e., to make the shift amount larger), it is preferable to use a liquid crystal material with a higher anisotropy of dielectric constant (permittivity) between the long axis and the short axis directions in a liquid crystal molecule, and the nematic liquid crystal is generally excellently used. Moreover, the larger the electromagnetic coupling between the high frequency electric field 21 confined in a resonator and the liquid crystal, the better. Since the microstrip resonator 11 has a simple resonator structure and a relatively higher degree of freedom in design, it is possible to adjust the confinement of the high frequency electric field in the microstrip resonator 11.

Now, the range in which the oscillation frequency can be varied in this embodiment will be estimated. Therefore, when fn represents an oscillation frequency which depends on the n-th order (n being a natural number) resonance mode of the microstrip resonator 11, $\Delta f$ represents a shift amount of fn, $\sqrt{\epsilon eff}$ represents a root square of the effective dielectric constant of the microstrip resonator 11, and $\Delta\sqrt{\epsilon eff}$ represents the amount of a change of $\sqrt{\epsilon eff}$ due to the liquid crystal 13, the relation of $\Delta f/fn = \Delta\sqrt{\epsilon eff}/\sqrt{\epsilon eff}$ will hold approximately.

(i) When a nematic liquid-crystal 4'-n-pentyl-4-cyanobiphenyl is selected as a material of the liquid crystal 13, it is known that $\Delta\sqrt{\epsilon r}$ is about 0.2 in a region of 0.3 THz to 1.4 THz, and $\sqrt{\epsilon r}$ is about 1.7 at 1 THz (See, Applied Optics, vol 42, page 2372 (2003)).

(ii) A structure is assumed in which the magnitude of the electromagnetic coupling between the microstrip resonator 11 and the liquid crystal 13 is relatively large, and it is assumed that the relation between the effective dielectric constant $\epsilon eff$ in the microstrip resonator 11 and the dielectric constant $\epsilon r$ of the liquid crystal 13 is $\sqrt{\epsilon eff} = 0.9 \sqrt{\epsilon r}$ (See, Brian C. Wadell, "Transmission Line Design Handbook", ARTECH HOUSE INC, chapter 3 (1991)).

When fn=1 THz, the range of the variable frequency estimated from (i) and (ii) above is 1.00 to 1.11 THz. Thus, this means that a shift of 11% of the oscillation frequency can be attained, which can be said to be a relatively larger shift as compared to a shift attained by a conventional method using a variable capacitance element.

As described above, in one embodiment of the frequency tunable oscillator according to the present invention, by utilizing the orientation of a liquid crystal with anisotropy of dielectric constant (permittivity) for modulating the electrical length of a resonator and by electrical-field-controlling the orientation, the oscillation frequency can be varied and the range of the variable oscillation frequency can also be made relatively large. Further, in this embodiment, it is also possible to use an electric field of DC to low frequency as a controlling electric field for varying the orientation of the liquid crystal molecules, and the frequency tunable oscillator according to the present invention can also operate as an oscillator that can perform frequency modulation (FM).

Figure 3:
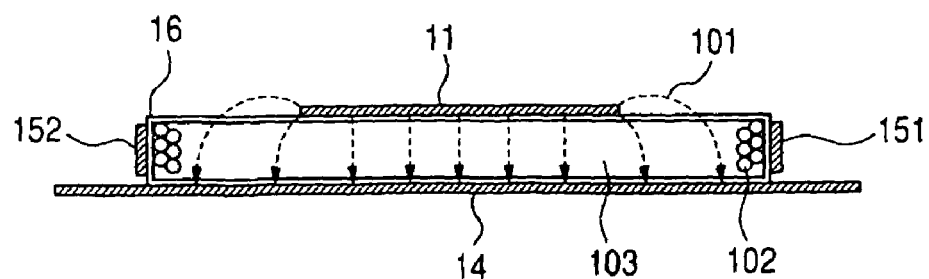
FIG. 3 is a cross-sectional view illustrating another embodiment of the frequency tunable oscillator according to the present invention.
Figure 4:
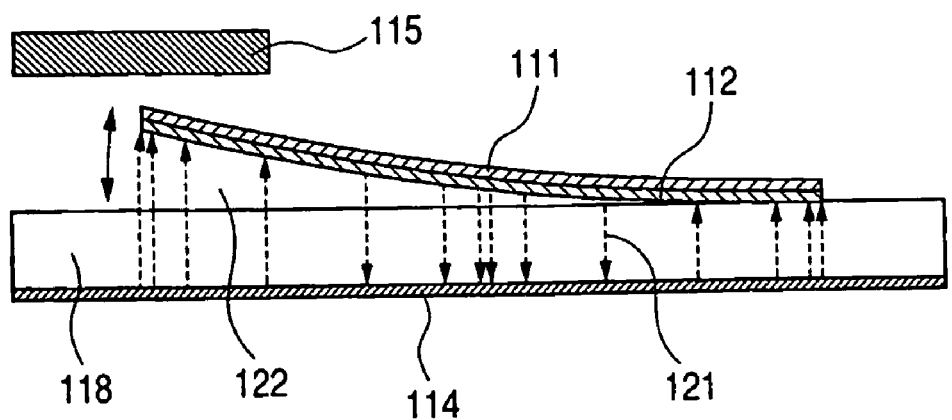
FIG. 4 is a cross-sectional view illustrating still another embodiment of the frequency tunable oscillator according to the present invention.

However, the embodiments of the frequency tunable oscillator according to the present invention are not limited to this. For example, there can be effectively adopted a method of modulating an electrical length by utilizing a spatial distribution of permittivity concentration due to electric field control of electrophoretic particles (see FIG. 3), or a method of modulating an electrical length by utilizing a change in an effective permittivity due to thermal control of a bimetal alloy (see FIG. 4). FIG. 3, which is a view showing a cross-sectional structure taken along a lateral direction (the direction perpendicular to the longitudinal direction of a resonator), illustrates the state in which the distribution of charged particles 102- in an electrophoretic particle solvent 103 varies by an electric field control through a pair of controlling electrodes 151, 152. In this manner, the permittivity distribution due to the electrophoretic particles electromagnetically coupled to the high frequency electric field 101 confined in the microstrip resonator 11 will vary, whereby the electrical length of the resonator 11 is modulated. FIG. 4, which is a view showing a cross-sectional structure taken along the longitudinal direction of a resonator, illustrates the state in which an effective permittivity in a bimetal alloy (being a microstrip resonator) of two kinds of metals 111, 112 formed on a dielectric 118 varies by thermal control through an external thermal control device 115. The bimetal alloy 111, 112 can be deformed into variously shapes by thermal control, thereby forming various shapes of spacing 122 between itself and the dielectric 118. In this manner, the permittivity sensed by a high frequency electric field 121 confined in the microstrip resonator 11 will vary, whereby the electrical length of the resonator is modulated. Incidentally, reference numeral 114 denotes a ground conductor.

Moreover, as a method for taking out an oscillation output of the frequency tunable oscillator according to the present embodiment, it is possible to select one of some well-known methods. For example, there is a method in which a high frequency transmission line is electromagnetically coupled to the microstrip resonator 11 so as to take out a part of the oscillation output into an external circuit. In addition, there can also be utilized a method such that a microstrip resonator 11 in which an electromagnetic field captured thereby has a far field is used so as to take out a part of the oscillation output into an external space.

EXAMPLES

Now, referring to the attached drawings, more specific Examples will be described below.

Example 1

Figure 5:
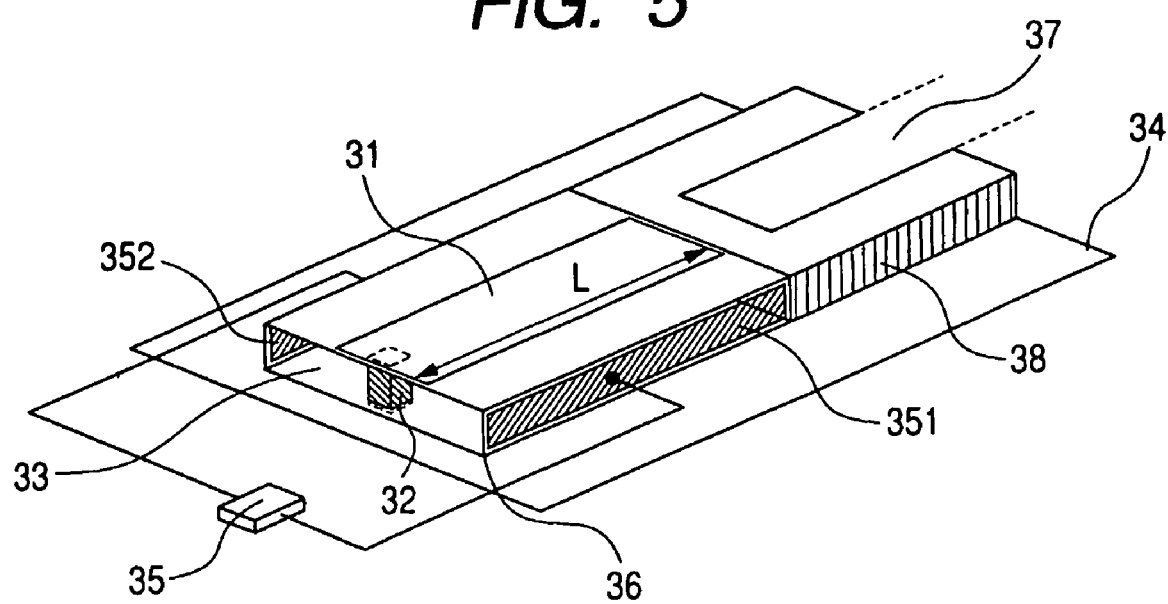
FIG. 5 is a perspective view illustrating Example 1 of the present invention.

FIG. 5 is a perspective view showing a structure of Example 1 of the frequency tunable oscillator according to the present invention. In Example 1, as a resonator, an MSL resonator 31 is used which is prepared by cutting a microstrip line (MSL) into a finite length with open ends. A resonant tunneling diode 32, which is a negative resistance element, has an active structure based on a photon-assisted tunneling using an InGaAs/InAlAs semiconductor material lattice matching with an InP substrate as a multiquantum-well structure. The active structure has a multi-layer structure made of, for example, InGaAs(4.0 nm)/InAlAs(8.4 nm)/InGaAs(4.4 nm)/InAlAs(5.4 nm)/InGaAs(4.0 nm), and obtains a gain of a millimeter-wave band to a terahertz-wave band. The resonant tunneling diode 32, together with the MSL resonator 31 and a ground conductor 34 selected as two terminals, after being subjected to processes such as etching, embedding, vacuum evaporation of a metal thin film and the like, forms a feedback circuit.

At that time, as to the position of the resonant tunneling diode 32, a position being offset with respect to a center (a position that is not a node) in the resonator length L direction of the MSL resonator 31 is selected. As for the width direction perpendicular to the length direction, when the center (a position of a node) is selected, the electromagnetic field captured in the MSL resonator 31 selects the resonator length L, thereby resulting in oscillation. The nematic liquid crystal 4'-n-pentyl-4-cyanobiphenyl 33, which is a distributed constant material, is held by a holding material 36 so as to be positioned between the MSL resonator 31 and the ground conductor 34. As described already above, the high frequency electric field in the MSL resonator 31 is strongly influenced by the orientation of the liquid crystal molecules in the nematic liquid crystal 4'-n-pentyl-4-cyanobiphenyl 33. Therefore, it is possible to modulates the electrical length of the MSL resonator 31 by controlling the orientation through controlling electrodes 351, 352, thereby making the oscillation frequency variable.

Selection is performed such that the reactance associated with the inner structure and mounting structure of the resonant tunneling diode 32 becomes zero. The oscillation frequency derived from a fundamental mode of the MSL resonator 31 is expressed by $f_1=c/(2 \times L \times \sqrt{\epsilon eff})$ (wherein c is a light velocity in vacuum, and L is the length of the MSL resonator).

Accordingly, when it is designed such that the resonator length L of the MSL resonator 31 is 96 µm, the width is 12 µm, and the spacing between the MSL resonator 31 and the ground conductor 34 is 2 µm, in the MSL resonator 31, $\sqrt{\epsilon eff}$ becomes 1.53, whereby an oscillation frequency $f_1=1$ THz is obtained. At this time, it is preferable that the external electric field control device 35 (including the controlling electrodes 351, 352) is configured so as to be apart by a sufficient distance (for example, 10 µm) from the MSL resonator 31 in order not to be electromagnetically coupled to the electromagnetic field captured in the MSL resonator 31. When the magnitude of the controlling electric field is increased, the liquid crystal molecules in the nematic liquid crystal 4'-n-pentyl-4-cyanobiphenyl 33 change their orientation so as to be aligned in the direction of the controlling electric field through the external electric field control device 35 (the controlling electrodes 351, 352). Accordingly, their orientation results in not being aligned in the direction of the high frequency electric field in the MSL resonator 31, whereby, as estimated above, the oscillation frequency shifts from 1 THz to 1.11 THz. On the contrary, when the magnitude of the controlling electric field is decreased, the orientation of the liquid crystal molecules comes to be aligned in the direction of the high frequency electric field in the MSL resonator 31, whereby the dielectric constant (permittivity) of the liquid crystal electromagnetically coupled to the high frequency electric field becomes higher to increase the electrical length of the MSL resonator 31, so that the oscillation frequency shifts to the low frequency side.

Here, it is preferred that a bias supply (not shown) to the resonant tunneling diode 32 is made by connection via a bias T or low pass filter so as not to affect the high frequency in the MSL resonator 31.

In FIG. 5, a MSL 37 is provided on a dielectric 38 for taking out the oscillation output to an external circuit. The MSL 37 is electromagnetically coupled to the MSL resonator 31 via capacitive coupling, so that a part of the oscillation output of the MSL resonator 31 comes to propagate in the MSL 37. Accordingly, it is possible to take out the oscillation output into an external circuit. Incidentally, considering a case in which the MSL 37 is not provided, since the both ends of the MSL resonator 31 are terminated while being open, a far field remains approximately above the MSL resonator 31 as a part of the resulting oscillation output. Thus, in this case, it is possible to take out a part of the oscillation output into an external space.

Example 2

Figure 6:
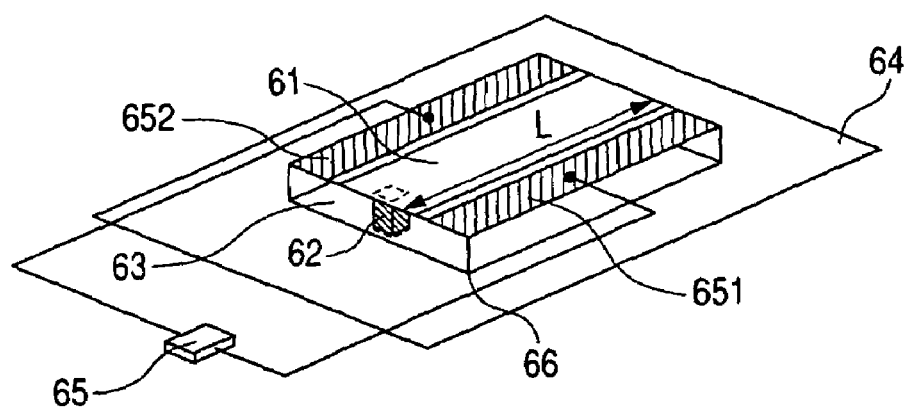
FIG. 6 is a perspective view illustrating Example 2 of the present invention.
Figure 7:
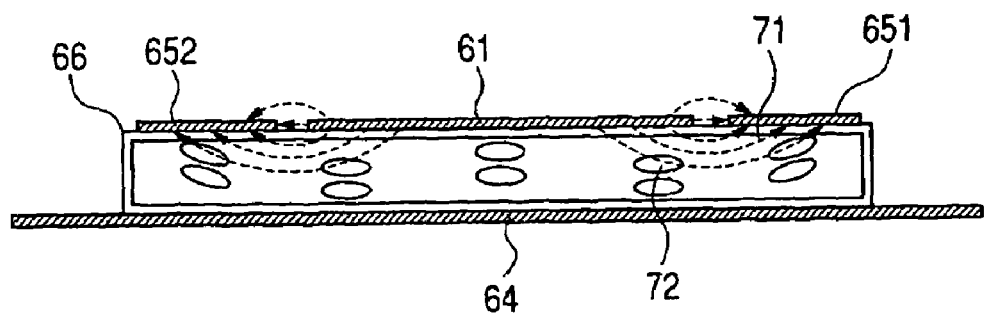
FIG. 7 is a cross-sectional view of FIG. 6.

FIG. 6 is a perspective view showing Example 2 of the frequency tunable oscillator according to the present invention. FIG. 7 is a view showing a cross-sectional structure in a lateral direction (a direction perpendicular to the length direction of the resonator) of FIG. 6. In Example 2, as a resonator, a CPW resonator 61 is used which is prepared by cutting a coplanar waveguide (CPW) into a finite length with open ends. Ground conductors 651, 652 in the CPW resonator 61 also act as controlling electrodes. Accordingly, a potential offset for generating an electric field for controlling of DC to a low frequency is accompanied between conductors 651 and 652 as controlling electrodes. However, since superposition of the high frequency electric field and the controlling electric field holds, it is possible to control the orientation of the liquid crystal molecules in the nematic liquid crystal 4'-n-pentyl-4-cyanobiphenyl 63 without problems. Incidentally, in FIGS. 6 and 7, reference numeral 62 denotes a negative resistance element such as a resonant tunneling diode, reference numeral 64 denotes a ground conductor, and reference numeral 66 denotes a holding material of the liquid crystal.

A high frequency electric field 71 captured by such CPW resonator 61 is shown in FIG. 7 showing the cross-sectional structure of FIG. 6. At this time, when the magnitude of the controlling electric field is increased, the liquid crystal molecules 72 in the nematic liquid crystal 4'-n-pentyl-4-cyanobiphenyl 63 change their orientation so as to be aligned in the direction of the controlling electric field through the external electric field control device 65 (controlling electrodes 651, 652). Thereby, their orientation comes to be aligned in the direction of the high frequency electric field 71 in the CPW resonator 61. Accordingly, the oscillation frequency shifts to the low frequency side. The other features are similar to those of Example 1.

Example 3

Figure 8:
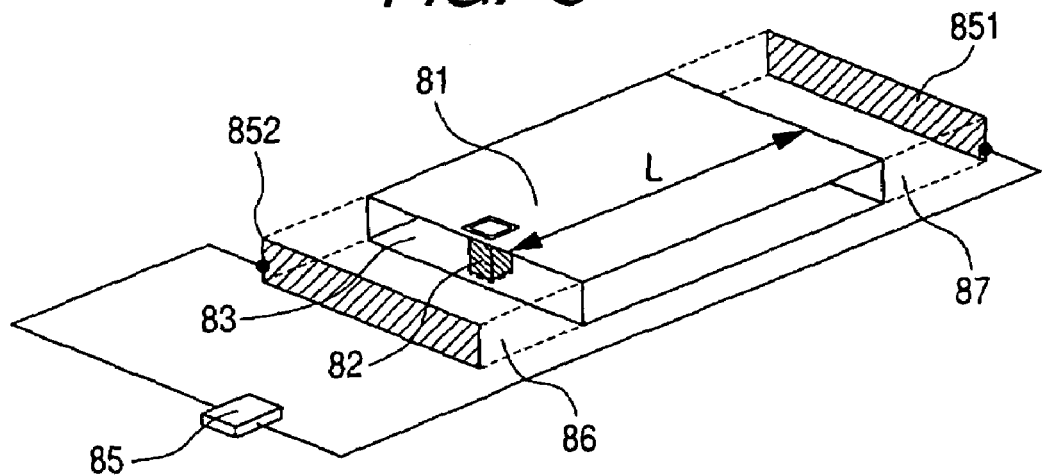
FIG. 8 is a perspective view illustrating Example 3 of the invention.
Figure 9:
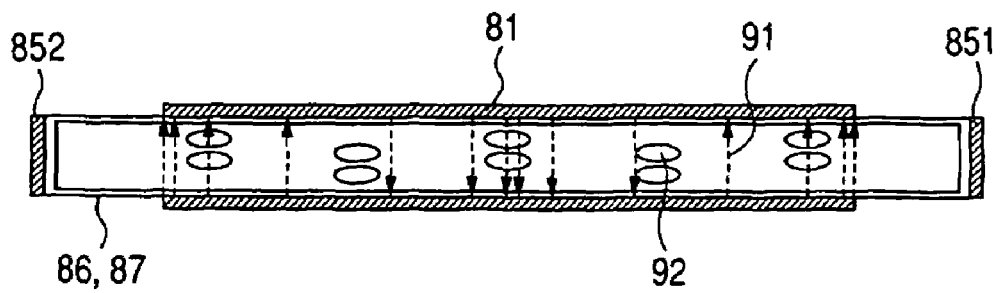
FIG. 9 is a cross-sectional view of FIG. 8.

FIG. 8 is a perspective view showing Example 3 of the frequency tunable oscillator according to the present invention. FIG. 9 is a view showing a cross-sectional structure in the length direction of the resonator of FIG. 8. In Example 3, as a resonator, a waveguide resonator 81 is used which is prepared by cutting a waveguide into a finite length with open ends.

It is necessary that a part of the waveguide resonator 81 is provided with a structure (a part above the resonant tunneling diode 82) for supplying a bias to the resonant tunneling diode 82 that is a negative resistance element. It is preferable that the bias supply (not shown) is performed so as not to affect the high frequency in the waveguide resonator 81. A pair of controlling electrodes 851, 852, which face each other in the resonator length direction, control the orientation of the liquid crystal molecules in the nematic liquid crystal 4'-n-pentyl-4-cyanobiphenyl 83 held by holding materials 86, 87. However, it is preferable that the controlling electrodes 851, 852 are configured so as to be apart by a sufficient distance (for example, 100 μm via the holding materials 86, 87) from the waveguide resonator 81 in order not to be electromagnetically coupled to the electromagnetic field captured by the waveguide resonator 81.

A high frequency electric field 91 captured by such waveguide resonator 81 is illustrated in FIG. 9 showing the cross-sectional structure of FIG. 8 in the resonator length L direction. At this time, when the magnitude of the controlling electric field is increased, the liquid crystal molecules 92 in the nematic liquid crystal 4'-n-pentyl-4-cyanobiphenyl 83 change their orientation so as to be aligned in the direction of the controlling electric field through the external electric field control device 85 (controlling electrodes 851, 852). Therefore, their orientation results in not being aligned in the direction of the high frequency electric field 91 in the waveguide resonator 81, whereby the electrical length of the waveguide resonator 81 is decreased, so that the oscillation frequency shifts to the high frequency side.

However, in the above Examples, the types of the microstrip resonator are not limited to those mentioned above. For example, a structure in which a slot line known as a high frequency transmission line is cut into a finite length is also included by the microstrip resonator. Also, as for a method for terminating the both ends of the high frequency transmission line cut into a finite length, it is also not limited to the method of terminating with two open ends.

Example 4

Figure 10A:
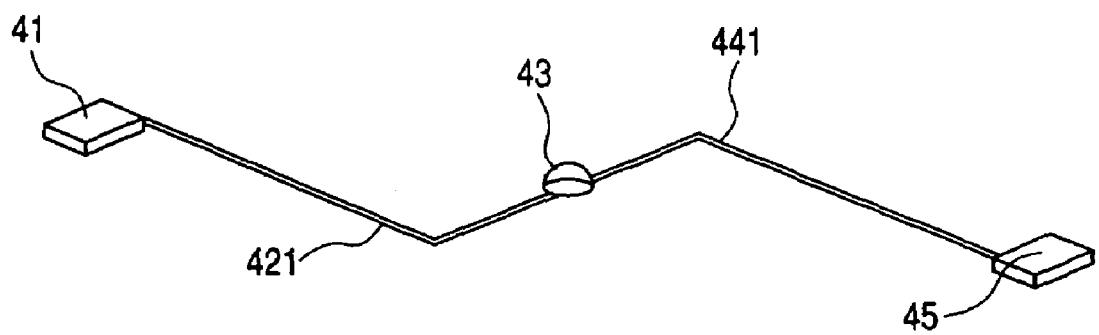
FIGS. 10A and 10B are perspective views illustrating Example 4 to a sensing apparatus of the invention.
Figure 10B:
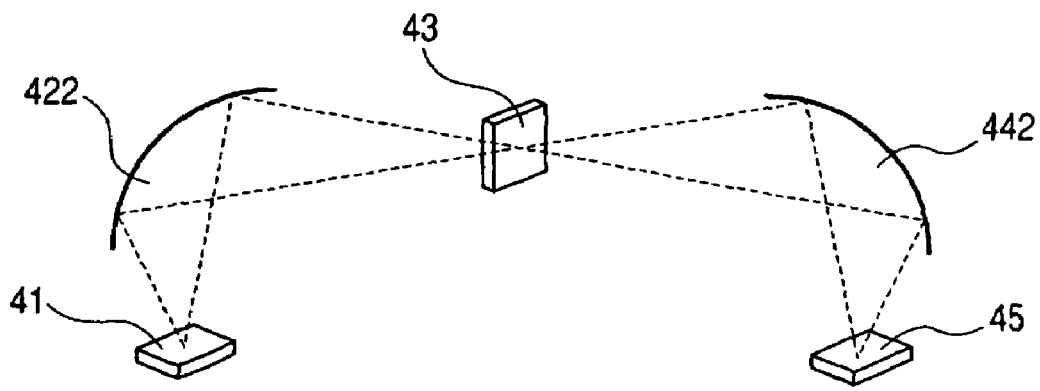
Figure 11A:
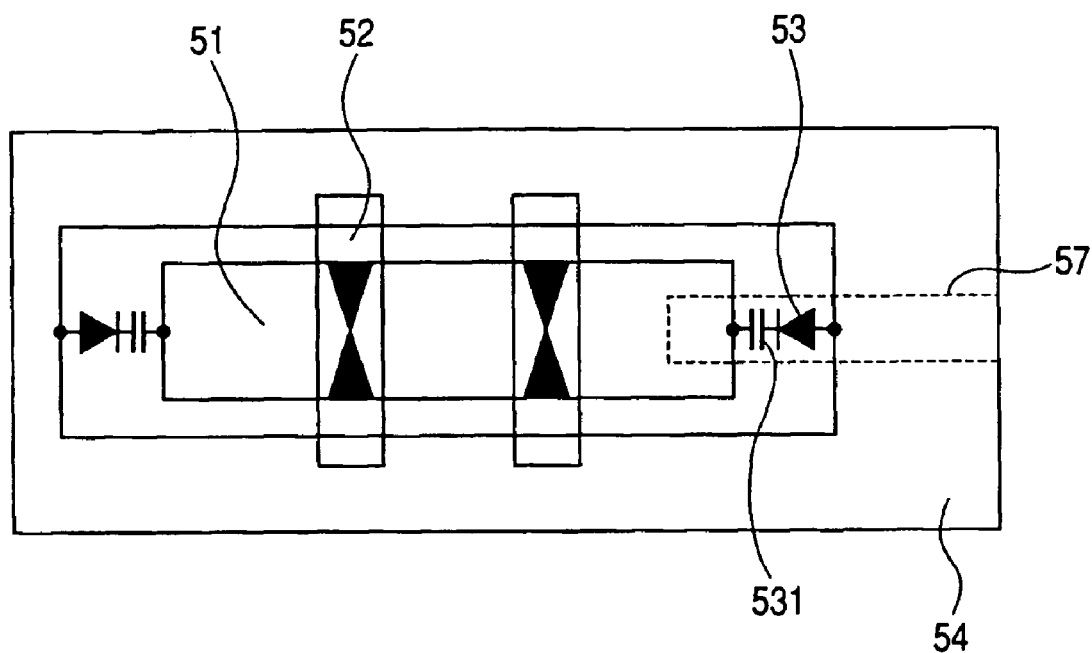
FIGS. 11A and 11B are views illustrating the frequency tunable oscillator of the prior art.
Figure 11B:
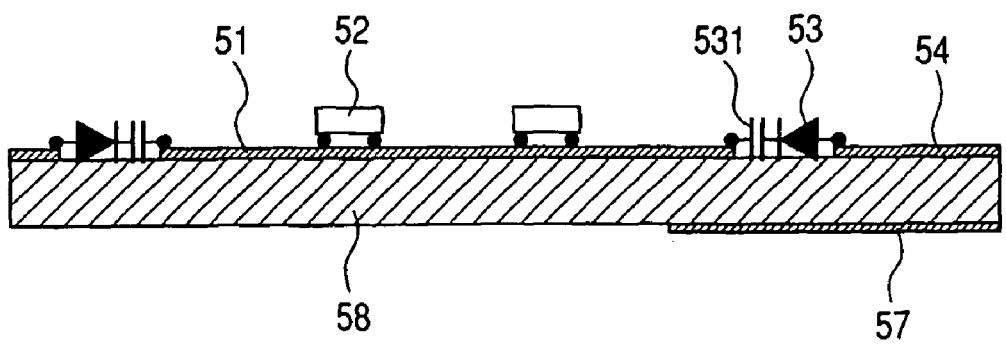

Example 4 relates to a sensing apparatus. FIGS. 10A and 10B show structures of Example 4 using the frequency tunable oscillator according to the present invention. The sensing apparatus of Example 4 includes a frequency tunable oscillator 41 according to the present invention, and causes an electromagnetic wave outputted from the frequency tunable oscillator 41 to pass through a sample 43. Then, an electromagnetic wave which carries an information to, for example, amplitude attenuation or phase delay derived from the complex dielectric constant of the sample is detected by a detector 45. At this time, by controlling the frequency of the electromagnetic wave outputted by the frequency tunable oscillator 41, the spectrum of complex dielectric constant of the sample 43 can be obtained. The wider the frequency range in which the oscillation frequency can be varied, the wider the obtained spectrum range. Thus, the frequency tunable oscillator according to the present invention is suitable for such a sensing apparatus.

At this time, as shown in FIG. 10A, a method of taking out an electromagnetic wave outputted from the frequency tunable oscillator 41 into an external circuit can be adopted to transmit the electromagnetic wave to a sample 43 through a first high frequency transmission line 421 and then input an electromagnetic wave that has passed through the sample into a detector 45 through a second high frequency transmission line 441. Alternatively, as shown in FIG. 10B, a method of taking out an electromagnetic wave into an external space can be adopted to collect the electromagnetic wave to a sample 43 through a first collector 422 and then input an electromagnetic wave that has passed through the sample into a detector 45 through a second collector.

Of the frequency tunable oscillator according to the present invention, a compact and tunable oscillator. of a frequency band from millimeter-wave to terahertz-wave is especially useful for a spectral technique for obtaining an absorption spectrum or complex dielectric constant of a substance, a technique for analyzing biomolecules, and sensing application through incorporation thereof into an apparatus.

This application claims priority from Japanese Patent Application No. 2005-093228 filed on Mar. 28, 2005, which is hereby incorporated by reference herein.

The invention claimed is:

1. A frequency tunable oscillator comprising a negative resistance element and a resonator together forming a feedback circuit, and further comprising, in at least a part of the feedback circuit, a distributed constant material so configured as to have a distributed constant such that an electrical length in the resonator is modulated and a modification means for externally modifying the distributed constant material, wherein the oscillation frequency is allowed to vary through the external modification by the modification means.

2. The frequency tunable oscillator according to claim 1, wherein the distributed constant material comprises a liquid crystal, and the modification means performs electric field control for changing the orientation of liquid crystal molecules as an external modification.

3. The frequency tunable oscillator according to claim 1, wherein the distributed constant material comprises electrophoretic particles, and the modification means performs electric field control for changing the spatial distribution of the electrophoretic particles as the external modification.

4. The frequency tunable oscillator according to claim 1, wherein the distributed constant material comprises a bimetal alloy, and the modification means performs thermal control for changing the shape of the bimetal alloy as the external modification.

5. The frequency tunable oscillator according to claim 1, wherein the resonator comprises a microstrip resonator formed by cutting a high frequency transmission line into a finite length.

6. The frequency tunable oscillator according to claim 5, wherein the high frequency transmission line is electromagnetically coupled to the microstrip resonator, and an oscillation output is taken into an outside circuit.

7. The frequency tunable oscillator according to claim 1, wherein the negative resistance element is a resonant tunneling diode based on photon-assisted tunneling.

8. A sensing apparatus comprising the frequency tunable oscillator set forth in claim 1, wherein an electromagnetic wave outputted from the frequency tunable oscillator is lead into an analyte, and an electromagnetic wave from the analyte carrying an information to the analyte is detected by a detection means.

* * * * *